United States Patent
Wilson et al.

(10) Patent No.: US 7,579,196 B2
(45) Date of Patent: Aug. 25, 2009

(54) INTERCONNECT CONNECTING A DIFFUSION METAL LAYER AND A POWER PLANE METAL AND FABRICATING METHOD THEREOF

(75) Inventors: Vicki Wilson, Saint Paul, MN (US); Guoqing Zhan, Saint Paul, MN (US); Ray Buske, Saint Paul, MN (US); James Chyi Lai, Saint Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 283 days.

(21) Appl. No.: 11/533,109

(22) Filed: Sep. 19, 2006

(65) Prior Publication Data

US 2007/0072312 A1    Mar. 29, 2007

Related U.S. Application Data

(60) Provisional application No. 60/721,217, filed on Sep. 28, 2005.

(51) Int. Cl.
*H01L 21/00* (2006.01)

(52) U.S. Cl. .................... 438/3; 257/421; 257/E21.665
(58) Field of Classification Search ................. 257/421, 257/E21.665; 438/3
See application file for complete search history.

(56) References Cited

U.S. PATENT DOCUMENTS

| 6,784,091 B1* | 8/2004 | Nuetzel et al. ............. 438/618 |
| 2005/0023581 A1* | 2/2005 | Nuetzel et al. ............. 257/295 |
| 2005/0145909 A1* | 7/2005 | Giebeler et al. ............ 257/295 |
| 2006/0081954 A1* | 4/2006 | Tondra et al. .............. 257/421 |
| 2006/0183318 A1* | 8/2006 | Liu et al. .................... 438/634 |

* cited by examiner

*Primary Examiner*—Marcos D. Pizarro
*Assistant Examiner*—Igwe U. Anya
(74) *Attorney, Agent, or Firm*—Thomas, Kayden, Horstemeyer & Risley

(57) ABSTRACT

A giant magnetoresistance (GMR) pad on the same level of GMR memory bit layer is used as an intermediate connection for plugs between the GMR pad and an underlying diffusion metal layer. A single large power metal plug is used to connect the GMR pad and the overlying power plane metal.

8 Claims, 2 Drawing Sheets

INTERCONNECT CONNECTING A DIFFUSION METAL LAYER AND A POWER PLANE METAL AND FABRICATING METHOD THEREOF

CROSS-REFERENCE TO RELATED APPLICATION

This application claims the priority benefit of provisional application Ser. No. 60/721,217, filed Sep. 28, 2005, the full disclosure of which is incorporated herein by reference.

BACKGROUND

1. Field of Invention

The present invention relates to a static memory. More particularly, the present invention relates to a magneto resistive random access memory (MRAM).

2. Description of Related Art

MRAM is a type of non-volatile memory with fast programming time and high density. A MRAM cell of giant magneto resistance (GMR) type has two ferromagnetic layers separated by a nonmagnetic conducting layer. Information is stored as directions of magnetization vectors in the two ferromagnetic layers.

The resistance of the nonmagnetic layer between the two ferromagnetic layers indicates a minimum value when the magnetization vectors of the two ferromagnetic layers point in substantially the same direction. On the other hand, the resistance of the nonmagnetic layer between the two ferromagnetic layers indicates a maximum value when the magnetization vectors of the two ferromagnetic layers point in substantially opposite directions. Accordingly, a detection of changes in resistance allows information being stored in the MRAM cell.

In conventional MRAM process, metal plugs used to connect a diffusion metal layer under a layer of GMR memory bits and a power plane metal over the layer of GMR memory bits have high contact resistance due to the small size and high aspect ratio of the metal plugs. Hence, there is a need to develop a low-resistance metal plug to connect the diffusion metal layer and the power plane metal.

SUMMARY

A giant magneto resistance (GMR) pad on the same level of GMR memory bit layer is used as an intermediate connection for plugs between the GMR pad and an underlying diffusion metal layer. A single large power metal plug is used to connect the GMR pad and the overlying power plane metal.

BRIEF DESCRIPTION OF THE DRAWINGS

The invention can be more fully understood by reading the following detailed description of the preferred embodiment, with reference made to the accompanying drawings as follows.

DETAILED DESCRIPTION

Reference will now be made in detail to the present preferred embodiments of the invention, examples of which are illustrated in the accompanying drawings.

Figure 1A:
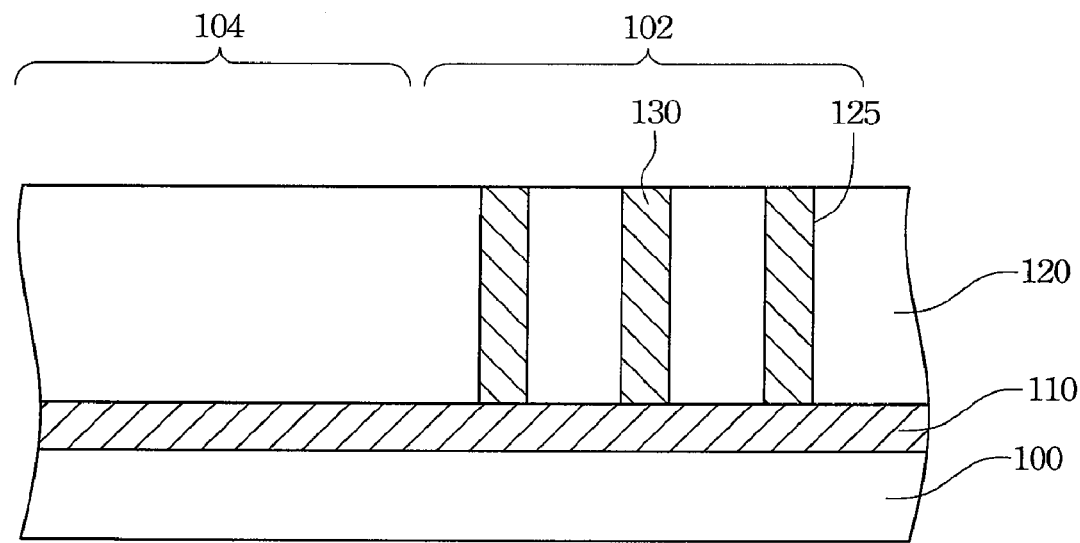
FIGS. 1A-1C are cross-sectional diagrams showing a method of fabricating a low-resistance metal plug for connecting a diffusion metal layer under MRAM devices and a power metal layer over the MRAM devices according to an embodiment of this invention.
Figure 1B:
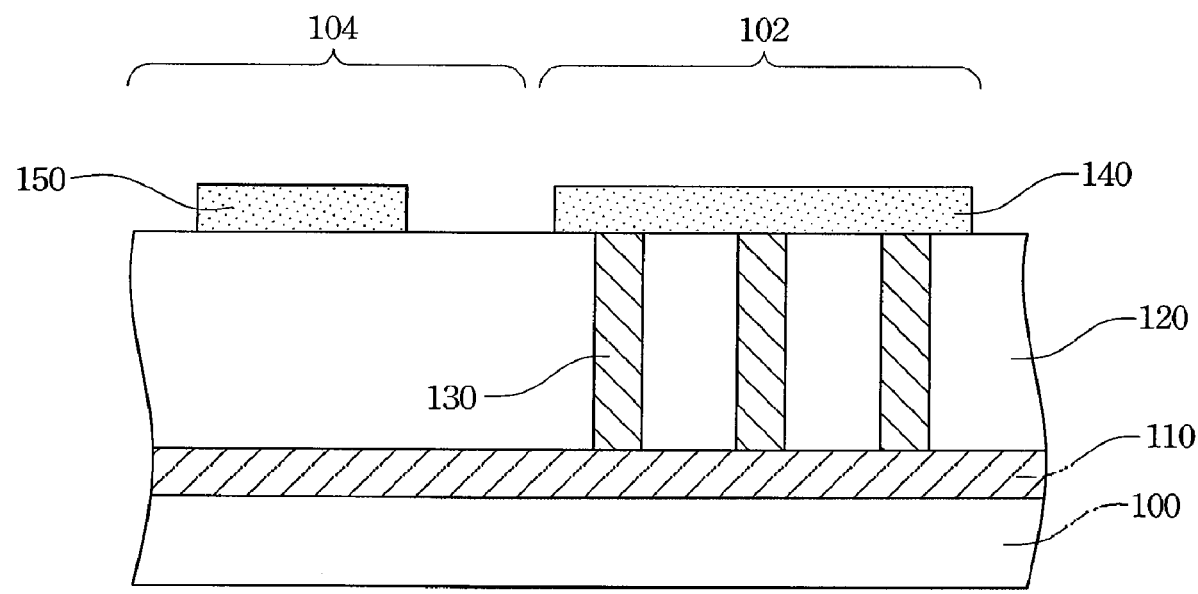
Figure 1C:
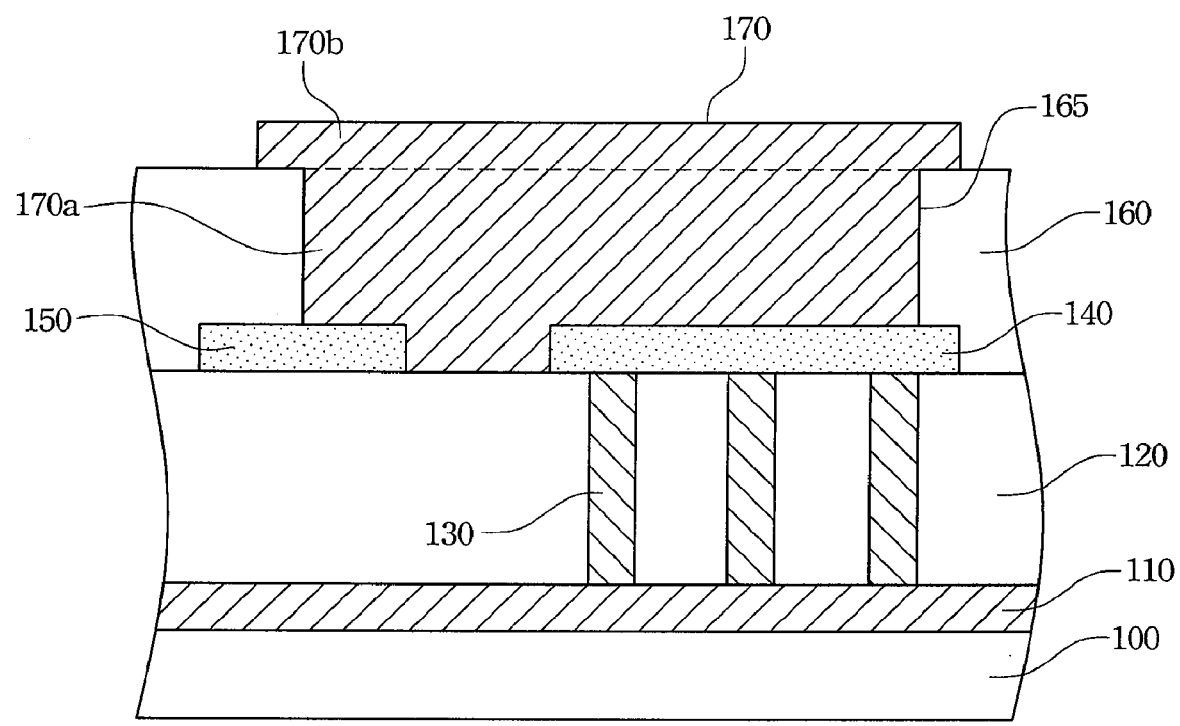

FIGS. 1A-1C are cross-sectional diagrams showing a method of fabricating a low-resistance metal plug for connecting a diffusion metal layer under MRAM devices and a power metal layer over the MRAM devices according to an embodiment of this invention. In FIG. 1A, a substrate 100 having a peripheral area 102 and a memory area 104 is provided. A diffusion metal layer 110 and a first dielectric layer 120 are sequentially formed on the substrate 100. After patterning the first dielectric layer 120 to form first openings 125 therein on the peripheral area 102, metal is deposited to fill the first openings 125 to form plugs 130.

A material of the diffusion metal layer 110 can be any conductive material, such as metal or metal alloy. For example, Cu or Al—Cu alloy are usually used to fabricate interconnects in semiconductor integrated circuits. A material of the first dielectric layer 120 can be, for example, silicon oxide or low-k dielectric materials. The first dielectric layer 120 can be patterned by, for example, a photolithography process and then an etching process. A material of the plugs 130 can be, for example, tungsten or other conductive metals.

In FIG. 1B, a GMR stack layer is deposited, on the first dielectric layer 120 and the plugs 130, and then patterned to form a GMR pad 140 on the peripheral area 102 and a GMR memory bit 150 on the memory area 104. The GMR pad 140 is located on the plugs 130 to electrically connect thereto. The GMR stack layer described above comprises a first ferromagnetic layer, a nonmagnetic conducting layer, and a second ferromagnetic layer.

In FIG. 1C, a second dielectric layer 160 is formed on the first dielectric layer 120, the GMR pad 140 and the GMR memory bit 150 and then patterned to form a second opening 165 in the second dielectric layer 160 to expose the GMR pad 140 and the GMR memory bit 150 simultaneously. Next, a conductive layer is formed on the second dielectric layer 160 and in the second opening 165 and then patterned to form a power metal layer 170 having a power metal plug 170a and a power plane metal 170b.

The material of the second dielectric layer 160 may be the same as that of the first dielectric layer 120 or not; the material can be, for example, silicon oxide or other suitable low-k dielectric material. The material of the power metal layer 170 can be, for example, metal or metal alloy, such as Cu or Al—Cu alloy.

According to the embodiment provided above, a GMR pad formed at the same time with the GMR memory bit serves as an intermediate connection of the power plane metal and the diffusion metal layer. Therefore, the aspect ration of the plugs can be decreased to increase the yield. Moreover, the single large power metal plug is used to connect the GMR memory bit, the GMR pad and the power plane metal to have advantages including much lower resistance and better step coverage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an interconnect connecting a diffusion metal layer and a power metal layer, comprising:

forming a dielectric layer on a diffusion metal layer, which is on a substrate having a peripheral area and a memory area;

patterning the dielectric layer to form first openings therein on the peripheral area to expose the diffusion metal layer;

forming metal plugs in the first openings to electrically connect the diffusion metal layer;

forming a GMR stack layer on the metal plugs and the dielectric layer;

patterning the GMR stack layer to format at least a GMR memory bit on the memory area and a GMR pad on the peripheral area, wherein the GMR pad electrically connects the metal plugs;

forming a second dielectric layer on the GMR memory bit, the GMR pad, and the first dielectric layer;

patterning the second dielectric layer to form a second opening to expose the GMR memory bit and the GMR pad; and forming a power metal layer in the second opening and on the second dielectric layer.

2. The method of claim 1, wherein the first and the second dielectric layer are silicon oxide or a low-k dielectric material.

3. The method of claim 1, wherein the metal plugs are tungsten plugs.

4. The method of claim 1, wherein the power metal layer is metal or metal alloy.

5. An interconnect connecting a diffusion metal layer and a power metal layer, comprising:

a diffusion metal layer on a substrate having a memory area and a peripheral area;

a first dielectric layer on the diffusion metal layer;

metal plugs in the first dielectric layer on the peripheral area to electrically connect the diffusion metal layer;

a GMR pad on the metal plugs to electrically connect the metal plugs, wherein the GMR pad is disposed on the same level of at least a GMR memory bit that is on the first dielectric layer over the memory area, and the GMR pad comprises a first ferromagnetic layer, a nonmagnetic conducting layer, and a second ferromagnetic layer;

a second dielectric layer on the GMR pad and the first dielectric layer; and a power metal layer in the second dielectric layer over the peripheral area and the memory area to electrically connect the GMR pad and the GMR memory bit, wherein the interconnect is electrically connected with the peripheral area and the memory area.

6. The interconnect of claim 5, wherein the first and the second dielectric layer is silicon oxide or a low-k dielectric material.

7. The interconnect of claim 5, wherein the metal plugs are tungsten plugs.

8. The interconnect of claim 5, wherein the power metal layer is metal or metal alloy.

* * * * *